United States Patent [19]

Tseng

[11] Patent Number: 5,705,417
[45] Date of Patent: Jan. 6, 1998

[54] METHOD FOR FORMING SELF-ALIGNED SILICIDE STRUCTURE

[75] Inventor: Horng-Huei Tseng, Hsinchu, Taiwan

[73] Assignee: Vanguard International Semiconductor Corporation, Hsinchu, Taiwan

[21] Appl. No.: 665,664

[22] Filed: Jun. 19, 1996

[51] Int. Cl.$^6$ .................................. H01L 21/336
[52] U.S. Cl. .................. 437/44; 437/41; 437/200; 148/DIG. 147
[58] Field of Search .............. 437/200, 44, 41 GS, 437/40 GS, 41 RLD; 148/DIG. 147

[56] References Cited

U.S. PATENT DOCUMENTS

| | | |
|---|---|---|
| 4,885,259 | 12/1989 | Osinski et al. |
| 5,300,455 | 4/1994 | Vuillermoz et al. ............... 437/190 |
| 5,352,631 | 10/1994 | Sitaram et al. ............... 437/200 |
| 5,508,212 | 4/1996 | Wang et al. ............... 437/200 |

FOREIGN PATENT DOCUMENTS 2-2136  1/1990  Japan ................ 437/44

*Primary Examiner*—Chandra Chaudhari
*Assistant Examiner*—Toniae M. Thomas
*Attorney, Agent, or Firm*—Christensen O'Connor Johnson & Kindness

[57] ABSTRACT

An improved method for forming a self-aligned silicide structure with reduced bridging effect is disclosed. The method includes forming a gate oxide on a substrate. Then a polysilicon layer is formed on the gate oxide. The polysilicon layer and the gate oxide are then patterned using a photoresist mask which defines a gate region. Next, the substrate is lightly-doped to form lightly-doped source/drain regions. Dielectric spacers are formed on a sidewall of the gate, and portions of the polysilicon layer and the substrate are removed with the dielectric spacers serving as a mask. A conductive layer is formed on the gate and the substrate, and is then silicided. Afterward, the unsilicided portions of the conductive layer are removed. Finally, heavily-doped source/drain regions are formed on the substrate with the dielectric spacers serving as a heavy-doping mask.

20 Claims, 5 Drawing Sheets

METHOD FOR FORMING SELF-ALIGNED SILICIDE STRUCTURE

FIELD OF THE INVENTION

The present invention relates to integrated circuit transistor fabrication and, more particularly, to a method for forming a self-aligned silicide metal oxide semiconductor (MOS) transistor.

BACKGROUND OF THE INVENTION

The field-effect operation of modern metal oxide semiconductor (MOS) transistors was first described by William Shockley in 1948. This field-effect operation was utilized in field-effect transistors (FETs), which thereafter have been manufactured in increasing numbers. Like a bipolar transistor, one type of FET, the MOS transistor or MOSFET generally has three contacts. More specifically, MOS transistors generally have contacts for a source region, a drain region and a gate electrode. In a MOS transistor, current of a particular polarity (positive current for a p-channel MOSFET and negative current for a n-channel MOSFET) is driven from the source region to the drain region, through a channel under the control of the gate. FIG. 1 shows the cross section of an exemplary metal-gate MOS transistor having a metal-gate 10 on top of an oxide 11, which is on top of a substrate 12 (thereby forming the "MOS" structure). The MOS transistor also includes a source 14 and a drain 16 formed in the substrate 12 having an opposite conductivity to that of the substrate. The source and drain 16 are located at the opposing ends of the gate 10. A channel region 18 separates the source 14 and the drain 16, and is aligned substantially beneath the gate 10.

In operation, when a voltage is applied to the gate metal 10, the electric field formed causes charge in the channel region to redistribute. For example, a positive voltage will tend to attract negative charge into the channel region. If the channel region is normally p-type, then the attracted negative charge can invert the conductivity of the channel region to the n-type. Thus surface of the semiconductor substrate 12 between the source 14 and the drain 16 is inverted and forms a conductive channel thereon.

For the metal-gate structure shown in FIG. 1, the metal-gate 10 is commonly made of a metal such as aluminum. In a typical process, due to the low melting point of aluminum, the aluminum must be deposited after the source region 14 and the drain region 16 are treated by a high temperature drive-in process. Further, the patterning of the metal-gate requires a positioning tolerance and adversely affects the packing density of the integrated circuit.

A polysilicon gate structure was developed for overcoming the drawbacks of the metal-gate structure. FIG. 2 shows the cross-section of the polysilicon gate structure. Owing to the high melting temperature of the polysilicon, the polysilicon gate 20 can be deposited prior to forming the source region 22 and the drain region 24. Furthermore, the doped polysilicon 20 has a low work function (often referred to as threshold voltage) compared to aluminum, thereby requiring less power and allowing the transistor to operate faster.

The disadvantage of the polysilicon gate structure is that polysilicon generally has a resistivity higher than aluminum and forms a poor contact with aluminum interconnect. Therefore, the "RC" time delay in charging the gate is much greater for polysilicon gates. Consequently, the formation of metal silicide layers on top of the polysilicon layers was developed, resulting in a gate structure referred to as polycide gate shown in FIG. 3. The polycide has a much lower resistivity and forms a better contact with aluminum than polysilicon. To form the polycide, a polysilicon plate 32 is formed on a thin gate oxide 30 Then silicide 34 is formed by reacting a metal with the upper portion of the polysilicon plate 32.

In a further refinement, a gate structure referred to as self-aligned silicide (salicide) gate structure, combines the polycide gate structure of FIG. 3 with a self-alignment technique. Self-alignment is one of the most important techniques in modern semiconductor integrated circuit fabrication, and especially becomes a vital factor in forming an ultra large scale integrated (ULSI) circuit.

Referring to the salicide gate structure in FIG. 4, a doped polysilicon gate 44 is formed on an active region. The source 40 and the drain 42 are lightly diffused using the doped polysilicon gate 44 as a mask. Thus, the source 40 and drain 42 are self-aligned with the gate 44. Then spacers of silicon dioxide 46 are formed on the sidewall of the gate 44. A heavy doping of portions of the source 40 and the, drain 42 is performed using the spacers 46 as implantation masks. The resulting doping profile is commonly referred to as a lightly doped drain (LDD). Afterward, a silicide layer 48 is formed to lower the sheet resistance of the gate and source/drain contacts by reacting silicon in the upper portion of the polysilicon gate 44 and the silicon in the source 40 and the drain 42 with a deposited metal such as titanium.

Unlike the process of FIG. 3, the self-alignment technique used in the salicide gate structure does not require an alignment tolerance in the photolithography process, thereby increasing the packing density. Moreover, the self-aligned process ensures that the source and drain are aligned with the gate. The examples in FIG. 5A and 5B illustrate how the misaligned transistors can affect the circuit performance. FIG. 5A shows a misaligned gate structure, in which the gate 50 overlaps source 52 and drain 54. The capacitance made from the overlap between the gate 50 and the source 52, and the capacitance made from the overlap between the gate 50 and the drain 54, degrades the MOS transistor performance. For example, these capacitances can reduce the speed of the transistor (i.e., increase the time needed to turn on and turn off the transistor). However, when the gate 56 (FIG. 5B) does not extend to the source 58 and the drain 59, the uncovered portions of the channel region between the source 58 and the drain 59 cannot be inverted, which prevents current from flowing between the source and the drain.

Referring back to FIG. 4, one purpose of the oxide spacers 46 is to separate the silicide gate structure and the source/drain regions 40 and 42. It is thought that while forming silicide, some silicon particles diffuse onto the spacers 46, which reacts with the titanium and forms unwanted silicide $TiSi_2$ over the surface of the spacers 46. This unwanted silicide can cause the gate structure to be undesirably short circuited to the source 40/drain 42. This condition is typically referred to as "bridging".

U.S. Pat. No. 4,885,259 entitled "Method of Manufacturing a Semiconductor Device, in which Metal Silicide is Provided in a Self-Registered Manner" issued to Kazimierz Osinski et. al., discloses a salicide fabrication method intended to overcome the bridging effect. This method uses an extra step of forming thick oxide spacers on the sidewalls of the conventional oxide spacers. These extra thick oxide spacers increase the distance the silicon particles must migrate to decrease the likelihood of forming a "bridge" that shorts the gate to the source or drain. Although the structure disclosed in this patent invention may reduce the bridging effect, it requires an extra step for forming the thick spacers, which increase the expense and time of fabricating the MOS transistor.

SUMMARY OF THE INVENTION

In accordance with the present invention, a method is provided for forming a self-aligned silicide structure that substantially reduces the bridging effect between gate and source/drain. In one embodiment, the method includes forming a gate oxide on a substrate, forming a polysilicon layer on the gate oxide, and patterning the polysilicon layer and the gate oxide using a photoresist mask, which defines a gate. The method then includes lightly doping the substrate using the gate as a mask to form lightly-doped source/drain regions, followed by forming dielectric spacers on the sidewalls of the gate. Then, the method proceeds to removing the upper portions of the polysilicon layer and the substrate with the dielectric spacers serving as a mask, forming a conductive layer on the gate and the exposed portions of the substrate, reacting conductive layer with the gate polysilicon and the exposed portions of the substrate to form a silicide. The next steps include removing the unreacted portions of the conductive layer, and forming heavily-doped source/drain regions on the substrate with the dielectric spacers serving as a doping mask.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 1:
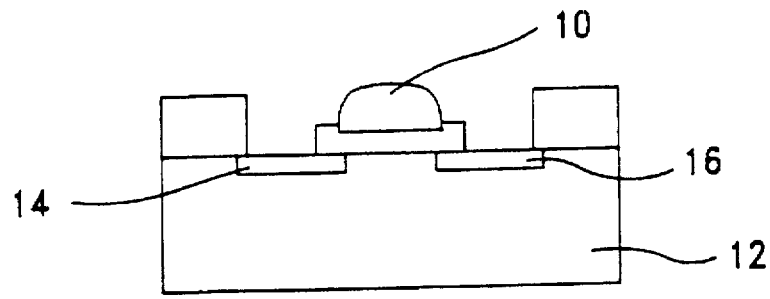
FIG. 1 shows a cross-sectional view of an exemplary metal-gate FET structure.
Figure 2:
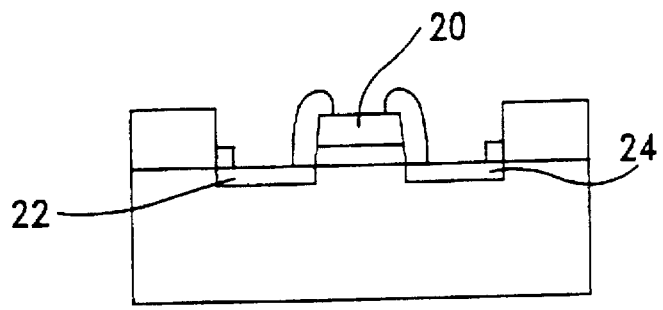
FIG. 2 shows a cross-sectional view of an exemplary polysilicon-gate FET structure.
Figure 3:
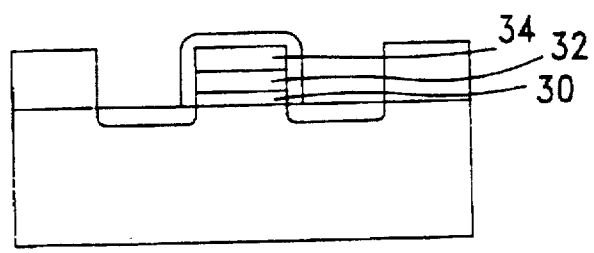
FIG. 3 shows a cross-sectional view of an exemplary polycide-gate FET structure.
Figure 4:
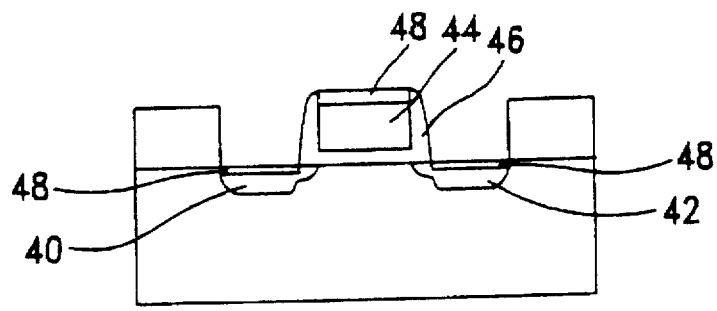
FIG. 4 shows a cross-sectional view of an exemplary self-aligned polycide (salicide) gate FET structure that is conventionally fabricated.
Figure 5A:
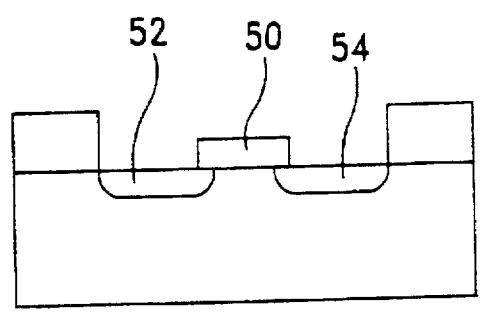
FIG. 5A illustrates a misaligned gate structure, in which the gate overlaps the source and drain regions.
Figure 5B:
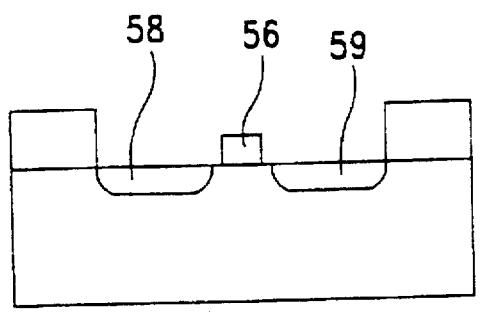
FIG. 5B illustrates a misaligned gate structure, in which the gate does not reach the source and drain regions.
Figure 6A:
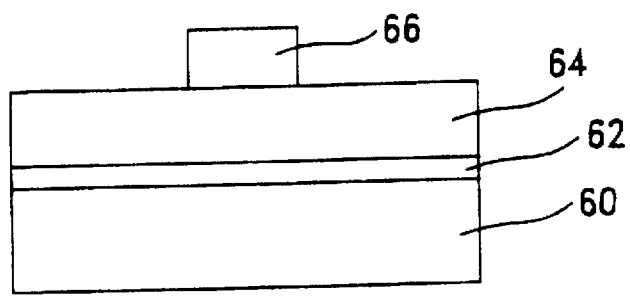
FIG. 6A to 6I show cross-sectional views illustrative of various stages in the fabrication of a salicide structure in accordance with one embodiment of the present invention.

FIG. 6A shows a schematic cross-section of an initial stage in fabricating a salicide structure according to one embodiment of the present invention. The structure includes a silicon substrate 60 having thereon a thin layer of silicon oxide 62. In this embodiment, the oxide layer 62 has a thickness of about 80–300 angstroms and is used as a gate oxide in a MOSFET (the term MOSFET is used hereinafter to also refer to polysilicon and/or silicide gate structures). A polysilicon layer 64 having a thickness of about 2000–4000 angstroms is deposited using any suitable low pressure chemical vapor deposition (LPCVD) process. In this embodiment, the LPCVD process forms the polysilicon layer 64 by the decomposition of silane at about 550°–650° C. at a pressure of about 0.2–1.0 torr, according to the reaction $SiH_4 \rightarrow Si+2H_2$.

The polysilicon layer 64 is doped to reduce resistivity using any suitable technique. For example, the polysilicon layer 64 can be doped while being deposited by adding arsine or phosphine to the silane gas mixture. Alternatively, doping can be performed alter deposition while performing source/drain doping (described below in conjunction with FIGS. 6B and 6I). Thereafter, a photoresist mask 66 is formed on the polysilicon layer 64 for defining the gate and the channel region for a MOSFET. The photoresist mask 66 is formed using standard photoresist coating, exposure and development processes.

Figure 6B:
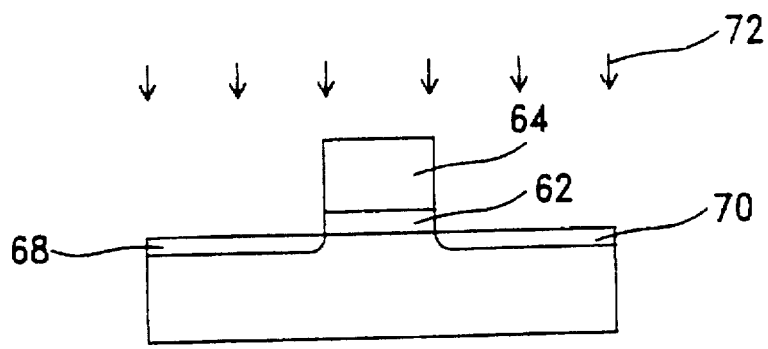

FIG. 6B illustrates a next stage of this embodiment of the salicide process. Portions of the polysilicon layer 64 and the gate oxide 62 are etched using the photoresist layer 66 as a mask. Typically, a plasma etch process with etchant of $SF_6/O_2$ is used. Next, lightly-doped n source region 68 and drain region 70 are formed using a conventional ion implant 72 method. Typically, a phosphorous or arsenic dopant is implanted at a dosage of about $1 \times 10^{13}$ ions/cm$^2$ with an implant energy of about 60 kilo electron volts (KeV). As in shown in FIG. 6B, the lightly-doped regions 68 and 70 each have an edge that is substantially vertically aligned with a sidewall of the gate 64.

Figure 6C:
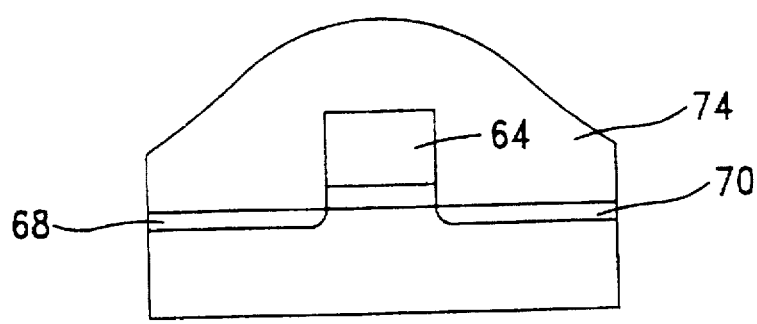
Figure 6D:
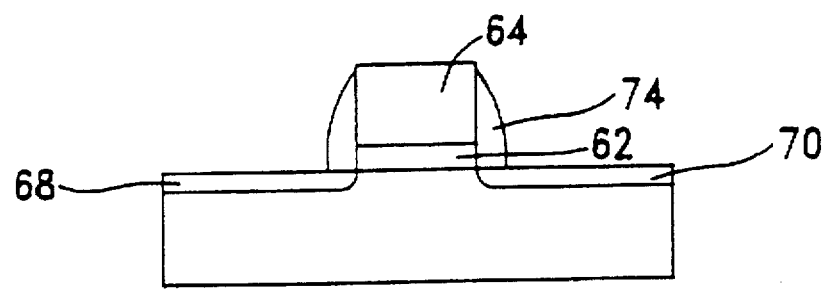

Referring to FIG. 6C, a dielectric layer such as a silicon oxide layer 74A is formed over the gate 64, the source 68 and the drain 70. In this embodiment, a CVD process is used to deposit the oxide layer 74A. Then, the oxide layer 74A is anisotropically etched to form spacer 74 on the sidewalls of the gate polysilicon 64 and the gate oxide 62. In one embodiment, the oxide layer 74A is etched using a conventional reactive ion etch (RIE) process. The resultant structure is shown in FIG. 6D. The oxide spacer 74 serves as an implant mask for a heavy implant in forming a LDD structure, described below in conjunction with FIG. 6I. In addition, the spacer 74 also forms a relatively small barrier between the gate 64 and the source and drain regions 68 and 70, which helps reduce the aforementioned bridging effect. The spacer 74 is typically about 1000 to 3000 angstroms wide where it contacts the source and drain regions 68 and 70, respectively.

Figure 6E:
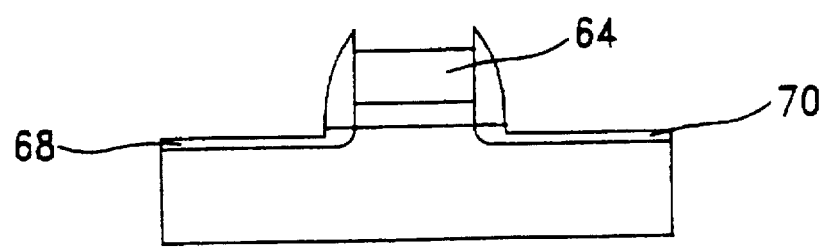

Next, an etching step is performed to etch the upper portions of the gate 64, the source region 68 and the drain region 70. Any suitable etching process selective for polysilicon can be used. For example, a dry etch process, such as a plasma etch process with a $HBr/Cl_2/SF_6$ etchant is used in one embodiment. As a result, the top surface of the gate 64 is recessed within the spacer. Also, most of the top surfaces of the source and drain regions 68 and 70 are below the bottom surface of the spacer. FIG. 6E shows the resultant structure. Although not well understood at this time, it is believed that diffusion of silicon particles from the gate 64 is substantially reduced because the polysilicon gate 64 is recessed within the spacer 74. The recess increases the distance the silicon particles must travel. In addition, it may be more difficult for the silicon particles to diffuse up and over the top of the spacer 74. Further, the etching of the source and drain regions 68 and 70 also increases the distance that the silicon particles must travel. Thus, unlike the aforementioned conventional process, a process according to the present invention does not require an additional spacer forming step to increase the distance between the gate and the source/drain regions. Moreover, without the extra thick spacer, the size of the MOSFET is reduced, thereby allowing greater density than the conventional structure.

Figure 6F:
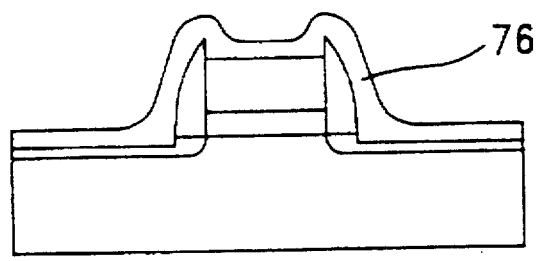

As shown in FIG. 6F, a conductive metal layer 76 having a thickness of about 50–300 angstroms is then deposited over the structure depicted in FIG. 6E. In this embodiment, the conductive metal layer 76 is deposited by sputtering. The metal layer 76 can include any metal suitable for reacting with silicon to form a silicide. For example, Group VIII metals (Pt, Pd, Co, Ni) and titanium are typically used in silicidation because of their low resistivities and low reaction temperatures.

Figure 6G:
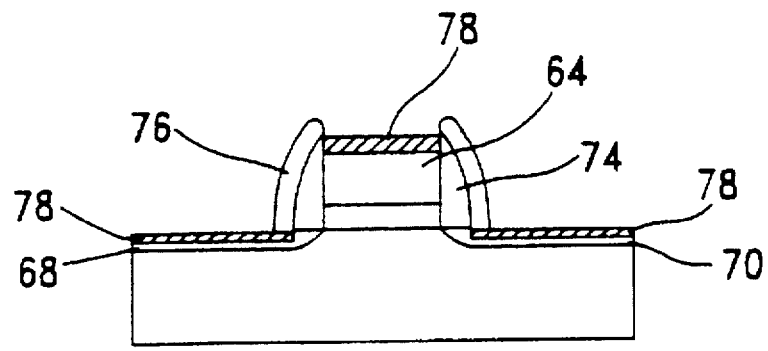

FIG. 6G illustrates a next stage in this embodiment of the salicide process of the present invention. The wafer is heated at temperature of about 600°–900° C. to react the metal layer 76 (FIG. 6F) with polysilicon to form a silicide. In a typical embodiment, a conventional furnace anneal or rapid thermal process (RTP) is used. Silicidation takes places wherever metal of the metal layer 76 contacts the silicon region. As a result, the gate 64, the source 68 and the drain 70 have silicide portions 78. In one embodiment, the metal layer 76 includes titanium, causing the silicide portions 78 to $TiSi_2$. In another embodiment, cobalt is used in the metal layer 76 to form $CoSi_2$ portions over the gate 64, the source region 68 and the drain region 70. The oxide spacer 74, however, are not be silicided, leaving the portions of the metal layer on the spacers substantially intact. The silicide film 78 has a thickness of about 200 to 700 angstroms, consuming about 100–300 angstroms of silicon or polysilicon.

Figure 6H:
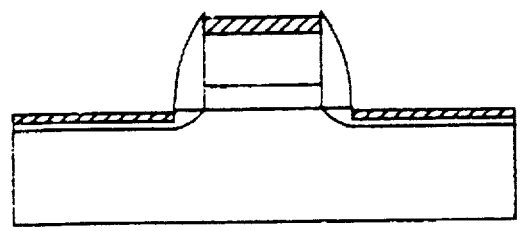

Referring now to FIG. 6H, the unreacted metal 76 (FIG. 6G) on the spacer 74A is selectively removed through the use of an etchant that removes only the metal 76 but not the silicide 78 and the oxide spacer 74. In one embodiment, an etchant of $HCl:H_2O_2(30\%)$ in a volume ration of 3:1 at room temperature is used to remove the unreacted metal 76. The resulting structure is shown in FIG. 6H.

Figure 6I:
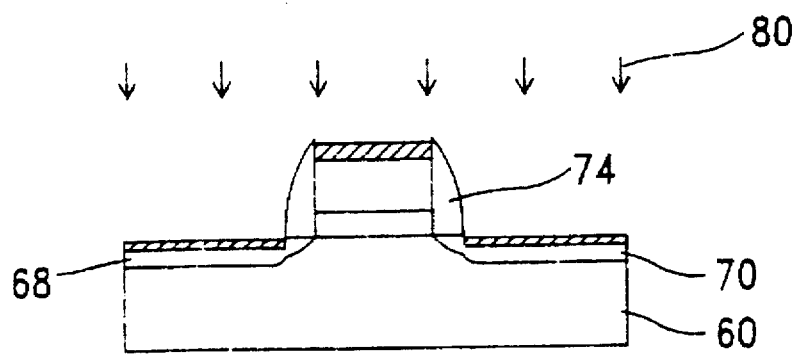

FIG. 6I illustrates a final stage of this embodiment of the present invention. A heavily-doped n+ source region 68A and a heavily-doped $n^+$ drain region 70A are formed using any suitable conventional ion implant process. For example, dopants 80, such as phosphorous or arsenic dopants, are implanted at a dose of about $6 \times 1^{15}$ ions/cm$^2$ with an implant energy of about 60 KeV, using the spacer 74 as an implant mask. Consequently, the heavily dope regions 68A and 70A are offset from the sidewalls of the gate 64, thereby forming the LDD doping profile. Afterward, the resultant structure is subject to an anneal (i.e., drive-in) step, which redistributes the dopant deeper into the substrate 60 by diffusion. The anneal is also required to activate the dopant, which initially does not rest on crystal lattice site and hence is not electrically active. Further, the anneal is used to remove crystal damage, which results from the collision of the implanted ions with host atoms within the substrate 60. The anneal is performed, for example, using a furnace at about 850°–1000° C. The anneal can alternatively be achieved by a conventional rapid thermal processing (RTP).

A MOSFET fabricated in accordance with the present invention results in an improved self-aligned silicide structure allows greater density while reducing the bridging effect.

The specific embodiments described above are illustrative of the principles of the present invention and are not intended to limit the invention to the specific embodiments disclosed. Although the preferred embodiment has been illustrated and described, it will be obvious to those skilled in the art that various modifications may be made without departing from the spirit which is intended to be limited solely by the appended claims.

The embodiments of the invention in which an exclusive property or privilege is claimed are defined as follows:

1. A method for forming a self-aligned silicide structure, said method comprising:

forming an oxide layer on a substrate;

forming a polysilicon layer on the oxide layer;

patterning the polysilicon layer and the oxide layer using a photoresist mask, wherein a gate region with a gate and gate oxide is formed;

doping the substrate to form lightly-doped source and drain regions using the gate as a doping mask;

forming a dielectric spacer on a sidewall of the gate;

removing a portion of the gate and removing portions of the substrate not covered by the dielectric spacer;

forming a conductive layer on the gate and the substrate;

reacting the conductive layer with portions of the gate and substrate to form a silicide;

removing portions of the conductive layer remaining after reacting the conductive layer with portions of the gate and substrate; and forming heavily-doped source and drain regions by ion implantation using the dielectric spacer as an implant mask.

2. The method according to claim 1, wherein the thickness of said gate oxide is about 80 to 300 angstroms.

3. The method according to claim 1, wherein the thickness of said polysilicon layer is about 2000 to 4000 angstroms.

4. The method according to claim 1, wherein the oxide layer is deposited by low pressure chemical vapor deposition.

5. The method according to claim 1, wherein said lightly-doped source and drain regions are formed by ion implantation.

6. The method according to claim 1, wherein said dielectric spacer is about 1000 to 3000 angstroms wide.

7. The method according to claim 1, wherein forming said dielectric spacer comprises:

forming a dielectric layer on the gate and the substrate; and etching anisotropically the dielectric layer to form the dielectric spacer on the sidewall of the gate.

8. The method according to claim 7, wherein said dielectric layer comprises a silicon oxide layer.

9. The method according to claim 7, wherein said etching anisotropically the dielectric layer comprises reactive ion etching.

10. The method according to claim 1, wherein said portions of the polysilicon and substrate are removed by a plasma etch process.

11. The method according to claim 10, where the etchant of said plasma etch process is $HBr/Cl_2/SF_6$.

12. The method according to claim 1, wherein said conductive layer comprises a metal layer.

13. The method according to claim 12, wherein said metal layer comprises a metal selected from the group of Pt, Pd, Co, Ni and Ti.

14. The method according to claim 12, wherein said metal layer is formed on the gate and the substrate by sputter deposition.

15. The method according to claim 1, wherein said conductive layer is reacted with portions of the gate and substrate using a temperature of about 600° to 900° C.

16. The method according to claim 1, wherein said conductive layer is reacted with portions of the gate and substrate using a rapid thermal process.

17. The method according to claim 1, wherein unreacted portions of the conductive layer are removed using an etchant of $HCl:H_2O_2$ (about 30%) in a volume ration of about 3:1.

18. The method according to claim 1, wherein said heavily-doped source and drain regions are formed by ion-implantation of dopants at a concentration of about $6 \times 10^{15}$ ions/cm$^2$ and an energy of about 60 KeV.

19. The method according to claim 18, further comprising annealing the heavily-doped source and drain regions.

20. The method according to claim 19, wherein said heavily-doped source and drain regions are annealed using a furnace.

* * * * *